United States Patent [19]

Glindmeyer et al.

[11] 4,220,182
[45] Sep. 2, 1980

[54] WOVEN FASTENER STRINGER

[75] Inventors: Friedrich Glindmeyer, Aachen; Karl Limpens, Stolberg, both of Fed. Rep. of Germany; Wilhelm F. Hennenberg, deceased, late of Constance, Fed. Rep. of Germany, by Anneliese Hennenberg, heir

[73] Assignee: Yoshida Kogyo K.K., Tokyo, Japan

[21] Appl. No.: 973,539

[22] Filed: Dec. 26, 1978

[30] Foreign Application Priority Data

Dec. 29, 1977 [JP] Japan ................................. 53-88

[51] Int. Cl.³ .................... A44B 19/42; D03D 1/00
[52] U.S. Cl. ........................ 139/384 B; 24/205.16 C
[58] Field of Search ............... 139/384 B; 24/205.1 C, 24/205.13 C, 205.16 C

[56] References Cited

U.S. PATENT DOCUMENTS

| 3,901,291 | 8/1975 | Nogai | 139/384 B |
| 3,921,679 | 11/1975 | Glindmeyer et al. | 139/384 B |
| 3,941,163 | 3/1976 | Glindmeyer et al. | 139/384 B |

FOREIGN PATENT DOCUMENTS

| 2333152 | 1/1975 | Fed. Rep. of Germany | 139/384 B |
| 50-85445 | 7/1975 | Japan | 139/384 B |

*Primary Examiner*—Henry Jaudon
*Attorney, Agent, or Firm*—Bucknam and Archer

[57] ABSTRACT

A woven stringer tape for a slide fastener is provided with a row of successively interconnected elongated loops secured to an edge of the tape by a plurality of warp threads and a binding weft thread cooperating with the warp threads in firmly retaining the row of loops in place against bending stresses. The binding warp threads are interlaced with the binding weft thread in close proximity to a common plane of upper legs of the successive loops, so that the upper legs inter alia are held in position against the tendency of getting misaligned when subjected to transverse bending stresses.

4 Claims, 2 Drawing Figures

WOVEN FASTENER STRINGER

BACKGROUND OF THE INVENTION

1. Field of the Invention

This invention relates to a slide fastener, and more particularly to a fastener stringer having a continuous plastic filament spirally formed and woven into an edge of a stringer tape during the weaving thereof by a needle loom.

2. Prior Art

There have been proposed a number of slide fasteners or zippers of the type described, which comprise a woven stringer tape and a plastic filament woven into a longitudinal edge of the tape, the filament being usually formed into a helical coil structure consisting of a succession of loops or elongated convolutions each having a coupling head, an upper leg and a lower leg and a connecting portion. A typical example of such fasteners is disclosed in DOS No. 2519829 wherein a preformed filament carrying a stiffening cord is inserted in the same manner as is the warp and interwoven with the weft into a longitudinal edge of a tape simultaneously as the latter is woven. Since the upper leg of each loop or convolution of the coiled filament in this prior art fastener stringer is not held in place by any weave thread, the result is that adjacent upper legs are prone to move out of the correct pitch, or the coupling filament on one stringer would often become disengaged from a corresponding filament on the other stringer when the fastener is subjected to bending stresses.

Another prior art example is disclosed in Japanese Laid-Open Publication No. 50-36250 wherein a warp thread is disposed over the upper legs of the coupling filament and interwoven in the spaces between adjacent filament loops with a weft thread. While this arrangement appears to provide secure anchorage of the coupling filament onto the tape, the warp thread extending over the filament tends to slip along the length of the loops and become shifted either toward the coupling head or the connecting portion under the influence of bends or twists, resulting in the failure to couple the two stringers, and the breakage of the warp thread in frictional contact with the slider.

Still another prior art fastener stringer is disclosed in Japanese Laid-Open Publication No. 50-85445 wherein additional warp and weft threads are used for binding the coupling filament onto the tape, such threads being interwoven with the core-filled filament over the upper legs of the latter. The binding weft thread in this arrangement passes around externally of the connecting portions of the successive loops and hence extends laterally of the tape so far as to come into frictional engagement with the slider, which would in turn cause sluggish movement of the slider or torn tape threads.

SUMMARY OF THE INVENTION

According to the invention, there is provided, a woven fastener stringer comprising a woven tape formed with foundation warp and weft threads and consisting of a web section defining a major dimension of said tape and a woven filament section defining a longitudinal edge portion of said tape; a row of successively interconnected elongated loops woven into said filament section, each of said loops having a coupling head at one end thereof, an upper leg and a lower leg extending from said head in a common direction, and a heel portion at the opposite end remote from said head connected to a next adjacent one of said successive loops; and a combination of binding threads comprising a plurality of binding warp threads extending in parallel relation over said upper legs and alternately overlying and underlying said foundation weft and a binding weft thread interlaced with said binding warp threads substantially in a common plane defined by the upper surfaces of said upper legs and looping around said foundation weft at a position interiorly of said heel portion.

It is therefore an object of the present invention to provide a stringer for a slide fastener which has a row of successively interconnected elongated loops or convolutions formed from a plastic filament and woven into a stringer tape, the row of elongated loops being stably secured in place against bending stresses.

Another object of the invention is to provide such a fastener stringer which is free of any thread in the region of movement of a slider, thereby preventing damage to the woven system.

Many other advantages and features of the present invention will become manifest to those versed in the art upon making reference to the detailed description and the accompanying sheet of drawings in which a preferred structural embodiments incorporating the principles of the present invention are shown by way of example.

DETAILED DESCRIPTION OF THE PREFERRED EMBODIMENTS

Figure 1:
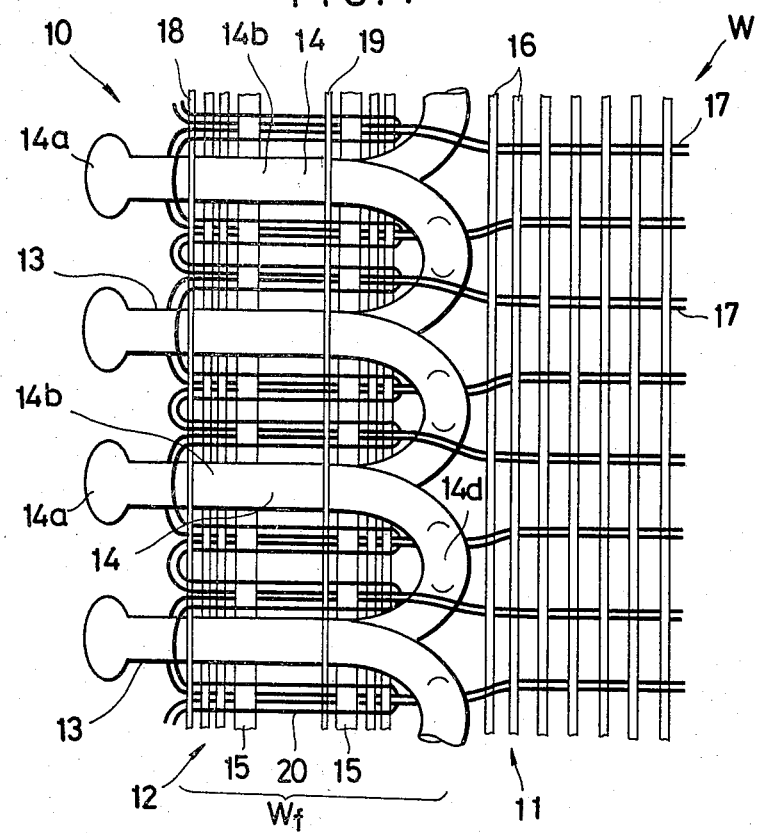
FIG. 1 is a plan view on enlarged scale of a portion of one of two identical fastener stringers provided in accordance with the invention.

A fastener stringer generally designated 10 constitutes one part of a pair or two identical stringers for a slide fastener. The stringer 10 consists of a generally flat web section W defining a major dimension of a woven tape 11 and a woven filament section $W_f$ defining a longitudinal edge portion 12 into which a filament 13 of plastic material is woven. The filament 13 is formed from a linear blank of a suitable plastic material into a helically coiled structure having a succession of loops or elongated convolutions. This is done during the course of weaving of the tape 11, for example in the manner disclosed in Japanese Laid-Open Publication No. 50-36250.

Each loop or elongated convolution 14 in the filament 13 has a coupling head 14a at one end thereof, an upper leg 14b and a lower leg 14c extending from the head 14a in a common direction and a heel portion 14d at the opposite end remote from the head 14a connected to a next adjacent one of the successive loops 14. The coupling head 14a is dimensioned to releasably couple with a corresponding head of a loop 14 on a mating stringer to open and close the fastener in the well known manner. The upper and lower legs 14b and 14c are spaced apart in substantially superimposed relation to each other as shown in FIG. 1 and define therebetween a longitudinally extending "tunnel" or hollow conduit through which a reinforcing string, cord or core 15 is inserted.

The web section W of the tape 11 may be of any known design having foundation warp threads 16 and foundation weft thread 17 interwoven in a variety of patterns, which will require no further explanation as this has no direct bearing upon the invention.

The term "filament woven section $W_f$" is used to define a longitudinal edge portion of the tape 11 into which the filament 13 serving as a coupling element for a slide fastener is woven. In addition to the foundation warp and weft system in the filament woven section $W_f$, there are provided a plurality of binding warp threads; two of such threads 18 and 19 being shown in the illustrated embodiment, and a binding weft thread 22 cooperating with the binding warp threads 18, 19 in securing the filament 13 firmly in place on the stringer tape 11.

Figure 2:
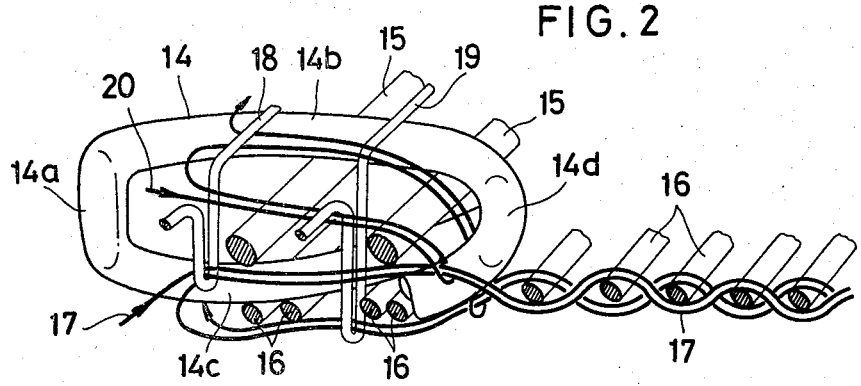
FIG. 2 is a diagrammatic, partly sectional, perspective view on enlarged scale of a segment of the portion of the fastener stringer shown in FIG. 1.

Each of the successive loops 14 of the coupling filament 13 has its lower leg 14c secured by the foundation warp 16 and weft 17 onto the woven filament section $W_f$. To further stabilize the fixation of the lower leg 14c to the tape 11, the foundation weft 17 is interlaced with the binding warp threads 18 and 19 which are laid in parallel relation longitudinally of the tape and extend over the upper legs 14b of the loops 14. As better shown in FIG. 2, the binding warp threads 18 and 19 alternately extend over and under the foundation weft thread 17 in the spaces between adjacent loops 14 at the woven filament section $W_f$ of the tape 11. The interlacing of the binding warp threads 18 and 19 with the foundation weft 17 also secures the upper leg 14b of each loop 14 against displacement, and this is strengthened by the insertion of the binding weft thread 22 which takes place substantially in a common plane defined by the upper surfaces of the upper legs 14b of the successive loops 14. The binding weft thread 22 extending substantially the entire length of the upper leg 14b of the loop 14, passes around the binding warp thread 18 over the upper leg 14b adjacent to the coupling head 14a and loops around the foundation weft 17 at a position interiorly of the heel portion 14d which interconnects the upper leg 14b of one loop with the lower leg 14c of a next adjacent loop of the filament 13. The binding weft thread 22 on its return trip passes alternately over and under the two parallel binding warp threads 18 and 19 in the spaces between each adjacent pair of loops 14. It will be thus noted that the particular combination of binding warp threads 18, 19 and binding weft thread 22 employed in accordance with the invention provides increased positional stability of the coupling filament 13 on the tape 11 against displacement when the fastener stringer 10 is subjected to binding stresses particularly in the transverse direction. More specifically, since the binding warp threads 18 and 19 are interlaced with the binding weft thread 22 in close proximity to the common plane of the upper leg surfaces of the successive loops 14, the upper legs 14b are anchored firmly in place against external forces tending to disturb the proper pitch or alignment of the row of coupling filament loops 14. The binding warp threads 18 and 19 are also secured in place at the region between the coupling head 14a and the heel portion 14d as the binding weft thread 22 holding the threads 18, 19 down against the upper legs 14b is arranged to loop around or interweave with the foundation weft 17 interiorly of the heel portion 14d and pass interlacingly around the binding warp thread 18 adjacent the coupling head 14a.

Since the joint of binding weft thread 22 and foundation weft 17 is located internally of the heel or connecting portion 14d, not beyond the external surface of this portion, there is no thread behind the heel portion 14d which would otherwise interfer with the movement of the slider.

Although various minor modifications may be suggested by those versed in the art, it should be understood that we wish to embody within the scope of the patent warranted hereon, all such embodiments as reasonably and properly come within the scope of our contribution to the art.

What is claimed is:

1. A woven fastener stringer comprising a woven tape formed with foundation warp and weft threads and consisting of a web section defining a major dimension of said tape and woven filament section defining a longitudinal edge portion of said tape; a row of successively interconnected elongated loops woven into said filament section, each of said loops having a coupling head at one end thereof, an upper leg and a lower leg extending from said head in a common direction, and a heel portion at the opposite end remote from said head connected to a next adjacent one of said successive loops; and a combination of binding threads comprising a plurality of binding warp threads extending in parallel relation over said upper legs and alternately overlying and underlying said foundation weft and a binding weft thread interlaced with said binding warp threads substantially in a common plane defined by the upper surfaces of said upper legs and looping around said foundation weft at a position interiorly of said heel portion, said binding weft thread passing around one of said plurality of binding warp threads adjacent to said coupling head and over said upper leg and alternately overlying and underlying said plurality of binding warp threads in the spaces between each adjacent pair of said loops.

2. A woven fastener stringer as defined in claim 1, including a reinforcing core which is inserted longitudinally of said tape between said upper and lower legs of said loops.

3. A woven fastener stringer according to claim 1 wherein said binding warp threads are interlaced with the foundation weft thread in spaces between adjacent pairs of said loops.

4. A woven fastener stringer according to claim 1 wherein said binding weft thread loops around said foundation weft thread at a position interior of the heel portion of a corresponding loop.

* * * * *